US009759747B2

(12) United States Patent
Schaefer et al.

(10) Patent No.: US 9,759,747 B2
(45) Date of Patent: Sep. 12, 2017

(54) METHOD AND A DEVICE FOR DETERMINING A TRIGGER CONDITION FOR A RARE SIGNAL EVENT

(71) Applicant: Rohde & Schwarz GmbH & Co. KG, Munich (DE)

(72) Inventors: Andrew Schaefer, Munich (DE); Kai Uwe Schmidt, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 32 days.

(21) Appl. No.: 14/442,080

(22) PCT Filed: Nov. 5, 2013

(86) PCT No.: PCT/EP2013/073002
§ 371 (c)(1),
(2) Date: May 11, 2015

(87) PCT Pub. No.: WO2014/072271
PCT Pub. Date: May 15, 2014

(65) Prior Publication Data
US 2015/0301086 A1    Oct. 22, 2015

(30) Foreign Application Priority Data

Nov. 12, 2012  (DE) .......................... 10 2012 220 523
Jan. 22, 2013  (DE) .......................... 10 2013 200 941

(51) Int. Cl.
*G01N 7/00*  (2006.01)
*G09G 5/00*  (2006.01)
*G01R 13/02*  (2006.01)

(52) U.S. Cl.
CPC ................. *G01R 13/0263* (2013.01)

(58) Field of Classification Search
CPC ................................................ G01R 13/0263
(Continued)

(56) References Cited

U.S. PATENT DOCUMENTS

| 5,003,248 A | 3/1991 | Johnson |
| 2003/0220753 A1 | 11/2003 | Pickerd et al. |

(Continued)

FOREIGN PATENT DOCUMENTS

| DE | 69525888 T2 | 9/2002 |
| DE | 102006056151 | 5/2008 |

(Continued)

OTHER PUBLICATIONS

Tektronix, Inc., "DPX Acquisition Technology for Spectrum Analyzers Fundamentals—Primer", Document No. 37W-19638-4, Beaverton, OR, USA 2009, pp. 1-20.

*Primary Examiner* — Farhana Hoque
(74) *Attorney, Agent, or Firm* — Lee & Hayes, PLLC

(57) ABSTRACT

A method and a device for determining a trigger condition for presenting a registered signal on a display of an oscilloscope on the basis of a rare signal event in the registered signal. The method and device determines a level-based and/or time-based distribution of frequencies of occurrence from level-based and/or time-based parameters determined from sampled values of the registered signal in a specified corresponding level-raster and/or time raster, and compares the determined level-based and/or time-based distribution of frequencies of occurrence with a previously given corresponding level-based and/or time-based reference-distribution of frequencies of occurrence. A first trigger condition is determined dependent upon an identified difference between corresponding level-based and/or time-based distribution of frequencies of occurrence and corresponding level-based and/or time-based reference-distribution of frequencies of occurrence. A trigger signal is activated if the trigger condition in the registered signal has been overstepped or undercut.

16 Claims, 17 Drawing Sheets

(58) Field of Classification Search
USPC .............. 324/76.13; 345/619; 73/23.2, 31.03
See application file for complete search history.

(56) References Cited

U.S. PATENT DOCUMENTS

| | | |
|---|---|---|
| 2010/0231398 A1 | 9/2010 | Engholm et al. |
| 2011/0231156 A1 | 9/2011 | Turpin |
| 2011/0273469 A1* | 11/2011 | Engholm ............ G01R 13/0227 345/619 |

FOREIGN PATENT DOCUMENTS

| | | |
|---|---|---|
| EP | 0701138 A2 | 3/1996 |
| EP | 2228660 A2 | 9/2010 |
| EP | 2385379 A2 | 11/2011 |
| WO | WO2008021485 A2 | 2/2008 |

* cited by examiner

Pulse width, measured in number of sampled values

METHOD AND A DEVICE FOR DETERMINING A TRIGGER CONDITION FOR A RARE SIGNAL EVENT

TECHNICAL FIELD

The invention relates to a method and a device for determining a trigger condition on the basis of a rare trigger event.

A digital real-time oscilloscope as shown in FIG. 1 comprises substantially an acquisition system 1, a post-processing system 2 and a display system 3. The acquisition system 1 contains an acquisition unit 4, which includes the data registration of the digitised signal and a digital data pre-processing—specifically, time displacement of the registered signal, signal equalisation, decimation and combination of several registered signals—a trigger unit 5, which generates a trigger signal dependent upon the registered and pre-processed signal and a trigger-logic unit, and an acquisition buffer 6, in which the acquired sampled values of the registered and pre-processed signal are stored in the case of an activated trigger signal.

The post-processing system 2 performs relatively complex signal-processing functions—for example, averaging, filtering, histogram preparation, jitter analysis, vectorial-signal analysis, measurement of signal-edge times, protocol decoding and so on—on the acquired sampled values of the registered and pre-processed signal.

Finally, the display system 3 comprises a visualisation unit 7, in which screen data for storage in the screen buffer 9 and subsequent presentation on a display 10 are determined from the post-processed, sampled values of the acquired signal, a processor unit 8 with an operating system, which conditions the screen data of the visualisation unit 7 and the data determined in the post-processing system 2 for presentation on the display, a screen buffer 9 and finally a display (screen) 10.

In the case of very high sampling rates of the measured signal to be displayed—for example, of a few gigahertz—the real-time requirement in the post-processing system and in the display system is significantly greater than in the acquisition system. Accordingly, the acquisition system must adjust the acquisition of new sampled values during a blind time, in order to complete the post-processing and display of the sampled values just acquired. Rare respectively sporadic events which occurred in the measured signal during this blind time are therefore not registered by the digital oscilloscope and not shown on the display.

The detection of such rare respectively sporadic events in the measured signal is particularly important for verification respectively error analysis (debugging) of devices, systems and signals. If the rare respectively sporadic event in the measured signal is known from its signal shape, it can be detected relatively easily and rapidly by adjusting an appropriate trigger condition. However, if the rare respectively sporadic event in the measured signal is unknown, the measurement must be implemented many times with a conventional trigger condition until it is registered by the acquisition system of the oscilloscope and appears on the display. The skill of the development engineer or test-station operator in the iterative selection of appropriate trigger conditions is often required in order to show on the display of the oscilloscope, and therefore also to detect, such rare respectively sporadic events in the measured signal in a relatively short time.

US 2011/0231156 A1 discloses a trigger device for a digital oscilloscope which quantifies the current interval between the signal event and the currently adjusted trigger condition by means of a code number. Disadvantageously, such a trigger device does not determine an appropriate trigger condition which can be adjusted—especially in an automated manner—for the signal event to be detected.

The object of the invention is therefore to develop a method and a device for the automatic adjustment of a trigger condition for a rarely occurring signal event.

The object is achieved by a method for determining a trigger condition on the basis of a rare signal event with the features described herein, by a method for identifying at least one rare signal anomaly in a registered signal with the features of the application disclosed herein and by a device for determining a trigger condition on the basis of a rare signal event with the features described herein.

According to the invention, level-based and/or time-based parameters, from which frequencies of occurrence are determined in a specified level-raster respectively time raster, are determined from the sampled values of the registered signal—before the acquisition of sampled values of the registered signal in the acquisition buffer. By comparing the determined level-based and/or time-based frequencies of occurrence with level-based and/or time-based reference frequencies of occurrence, differences are identified, from which a trigger condition is specified, which is designated in the following as a first trigger condition in order to distinguish it from further trigger conditions which will be described later.

If a signal event with the specified first trigger condition is identified in the registered signal, a trigger signal is generated for the acquisition of sampled values of the registered signal which always contain the rare signal event. The acquired sampled values of the registered signal can accordingly be subjected to an intensive analysis within the framework of a signal post-processing or software-supported signal analysis.

As the first trigger condition, a level-based and/or time-based threshold value is preferably used, which is designated in the following as a first level-based and/or time-based threshold value in order to distinguish it from further level-based and/or time-based threshold values which will be described later.

Moving the determination of a distribution of frequencies of occurrence of the registered signal, according to the invention, into the signal pre-processing phase, which is typically, in the prior art, implemented in the signal post-processing, allows information from the determined distribution of frequencies of occurrence of the registered signal to be taken into consideration in the triggering.

For example, the amplitude of the registered signal or a statistical level-based parameter of the registered signal, for example, the largest determined amplitude of a registered signal with time-variable amplitude can be used as the level-based parameter of the registered signal. A level-based distribution of frequencies of occurrence, for example, of a sinusoidal signal with sporadically superposed signal peaks at times of an amplitude delivers a distribution of frequencies of occurrence such as that shown in FIG. 2B.

By comparison with FIG. 2C, in which the distribution of frequencies of occurrence, for example, of a sinusoidal signal without sporadic superposed signal peaks, is shown as the reference-distribution of frequencies of occurrence, the region which represents the frequencies of occurrence of the sporadic superposed signal peaks is clearly evident from FIG. 2B, in the grey range illustrated above the frequencies of occurrence associated with the amplitude values in each case.

This range of frequencies of occurrence of the determined distribution of frequencies of occurrence assignable to the sporadic superposed signal peaks can be identified by comparison with the reference-distribution of frequencies of occurrence and preferably used to specify a first level-based threshold value as a first trigger condition. In fact, if the level-based threshold value of the triggering is adjusted in this level range of the level raster of the first level-based distribution of frequencies of occurrence assignable to the sporadic superposed signal peaks, a trigger signal is generated, which is activated upon the occurrence of the rare or sporadic signal event of a rare or sporadically superposed signal peak.

As an alternative or in addition to a first level-based threshold value, a first time-based threshold value can be used as a first trigger condition for generating the trigger-signal. For this purpose, in an equivalent manner to the determination of a first level-based threshold value, a time-based distribution of frequencies of occurrence can be compared with regard to differences with a time-based reference-distribution of frequencies of occurrence, and the first time-based threshold value in a time range associated with a rare or sporadic signal event can be specified within the time raster of the determined time-based distribution of frequencies of occurrence.

The time-based distribution of frequencies of occurrence is preferably determined on the basis of a time-based parameter—for example, a pulse duration of a binary measured signal—or on the basis of a statistical time-based parameter—for example, the smallest identified pulse duration of a binary measured signal—within a previously specified time raster.

Also, as a preferred special case of a time-based distribution of frequencies of occurrence, a time-based distribution of frequencies of occurrence can be investigated on the basis of a time-based parameter, in each case with different first, level-based threshold values—for example, the pulse duration of a saw-tooth measured signal with different level-based threshold value.

In a first preferred variant of the invention, the level-based and time-based distributions of frequencies of occurrence are determined from new over successive measurement intervals in each case. Such a determination of a distribution of frequencies of occurrence should advantageously be implemented with the minimum cost, wherein the validity of the distribution of frequencies of occurrence for determining a threshold value is present for the implementation of a triggering only after the expiry of a measurement interval.

In a second preferred variant of the invention, the level-based and time-based distributions of frequencies of occurrence are continuously updated either by deleting the oldest frequency-of-occurrence values from the distribution of frequencies of occurrence or by weighting the oldest frequency-of-occurrence values in the distribution of frequencies of occurrence more weakly and therefore taking them more weakly into consideration. A distribution of frequencies of occurrence determined in this manner is advantageously constantly valid without time offset, wherein the implementation costs turn out significantly higher by comparison with the first variant.

To achieve a rapid result in identifying differences between a determined frequency of occurrence and an associated reference frequency of occurrence, the determined distribution of frequencies of occurrence can preferably also be correlated with the associated reference-distribution of frequencies of occurrence.

In order to present on a display only a signal portion of the measured signal which provides a rare or sporadic signal event, and to suppress all other signal portions of the measured signal in a presentation on the display, a second triggering of the sampled values of the measured signal registered and buffered in the acquisition buffer is preferably implemented in addition to the determination according to the invention of a first trigger condition on the basis of a distribution of frequencies of occurrence based on sampled values of the registered measured signal.

The triggering activated upon the occurrence of a second trigger condition, preferably in the case of an overshooting or undercutting by the sampled values of the measured signal of a level-based and/or time-based threshold value, designated in the following as a second level-based and/or time-based threshold value, leads to a buffering of acquired sampled values of the measured signal in the acquisition buffer. The acquired sampled values of the measured signal are investigated in the signal post-processing with regard to a rare or sporadic signal event.

For this purpose, in a first embodiment of the invention, it is determined whether the acquired sampled values of the measured signal come to be disposed outside a sequence of successive time portions, in each case with an upper and lower threshold value. If this is the case, a rare or sporadic signal event has been detected, and the signal portion with the acquired sampled values of the measured signal is presented on a display. If no rare or sporadic signal event is detected in this manner, the associated single portion with the acquired sampled values of the measured signal is not presented on the display, and the signal post-processing is promptly interrupted, and the triggering is released again.

In this manner, only acquired signal portions of the measured signal which provide a rare or sporadic signal event are shown on the display, and the cost of the signal post-processing is advantageously reduced in favour of a relatively earlier triggering and accordingly a relatively earlier acquisition.

In a second preferred embodiment of the invention, the detection of the rare or sporadic signal event is brought forward from the signal post-processing into the triggering.

For this purpose, the sequence of sampled values of the measured signal acquired upon the occurrence of the second trigger condition, preferably in the event of an overshooting or undercutting of a second level-based and/or time-based threshold value by the sampled values of the measured signal, is investigated with regard to the presence of a rare or sporadic signal event before buffering in the acquisition buffer. If no rare or sporadic signal event has been identified in the acquired sequence of sampled values of the measured signal in this trigger phase, the acquired sequence of sampled values of the measured signal is not stored in the acquisition buffer at all, and no signal post-processing is commenced, but the triggering is released again.

In the first and second embodiment of the invention, the number of sequences with acquired sampled values of the measured signal in which, in the presence of the first embodiment of the invention, the signal post-processing is terminated early or in which, in the presence of the second embodiment of the invention, the signal post-processing is not even started in the first place, is preferably determined.

The method according to the invention for identifying at least one rare signal anomaly in a registered signal makes available to the user of the digital oscilloscope, before the acquisition of the registered signal, additional signal information about the registered signal, which would be lost with a conventional oscilloscope according to the prior art because of the existing blind time and dead time of the oscilloscope. This additional information gain is based on a level-based and/or time-based distribution of frequencies of occurrence of the registered signal before the acquisition of the registered signal.

BRIEF DESCRIPTION OF THE DRAWINGS

The individual embodiments and variants of the method according to the application and the device according to the application are explained in detail in the following with reference to the drawings.

DETAILED DESCRIPTION

Figure 1:
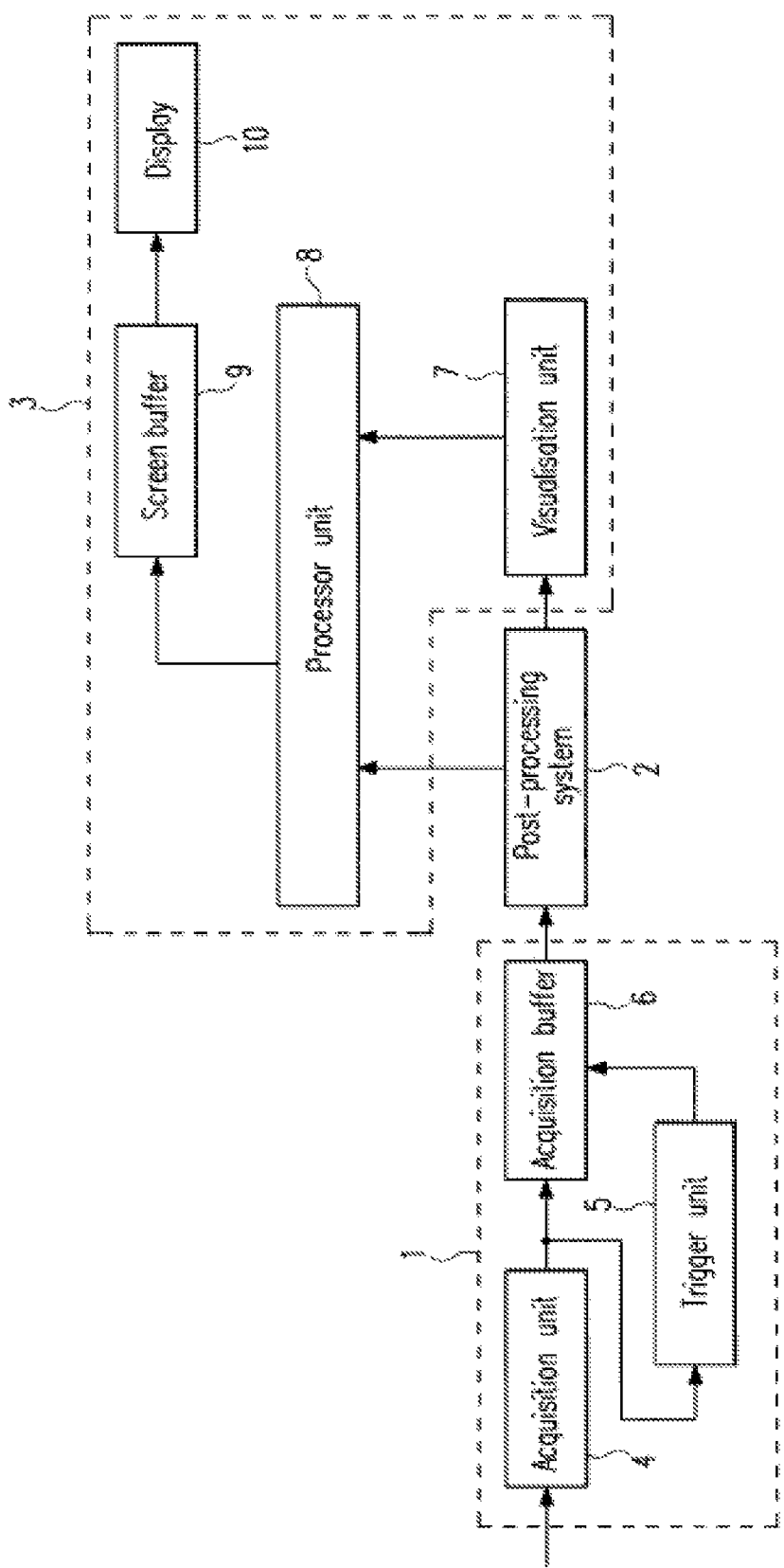
FIG. 1 illustrates a block-circuit diagram of a digital real-time oscilloscope.

In the following, an exemplary embodiment of the method according to the application for determining a trigger condition on the basis of a rare signal event is explained in detail with reference to the flow diagram in FIG. 17, and an exemplary embodiment of the device according to the application for determining a trigger condition on the basis of a rare signal event is explained in detail with reference to the block-circuit diagram in FIG. 15.

In the following, an exemplary embodiment of the method according to the invention for determining a trigger condition on the basis of a rare signal event is explained in detail with reference to the flow diagram in FIG. 17, and an exemplary embodiment of the device according to the invention for determining a trigger condition on the basis of a rare signal event is explained in detail with reference to the block-circuit diagram in FIG. 15.

In the first method step S10, the measured signal is registered and pre-processed in an acquisition unit 4. In the signal pre-processing, the measured signal is typically displaced in time, equalised, decimated in its sampling rate and combined in an additive, subtractive and/or inverted manner with other registered signals.

In the next method step S20, on the basis of the registered and pre-processed sampled values of the measured signal, a level-based and/or time-based distribution of frequencies of occurrence is determined in a unit 12 for determining frequencies of occurrence. In each case, level-based respectively time-based parameters are determined from the registered and pre-processed sampled values of the measured signal for the level-based and/or time-based distribution of frequencies of occurrence and arranged in a level-based respectively time-based raster.

The following parameters can, for example, be used as level-based parameters:
  Amplitude of the sampled values,
  Peak-peak spacing (English: peak-peak) of the sampled values,
  Overshooting distance (English: overshooting) of the sampled values.

The following parameters can, for example, be used as time-based parameters:

Rise time (English: rise-time) of a signal edge of sampled values,
Fall time (English: fall-time) of a signal edge of sampled values,
Pulse width (English: pulse width) of pulses of sampled values,
Period of sampled values,
Relative duty cycle (English: duty cycle) of pulses of sampled values,
Pulse number of pulses of sampled values.

Alongside these level-based and time-based parameters, the following statistical level-based and time-based parameters can also be used:

Maximal sampling value, maximal pulse duration, maximal rise time, maximal fall time, maximal relative duty cycle and so on,
Minimal sampled value, minimal pulse duration, minimal rise time, minimal fall time, minimal relative duty cycle and so on,
Mean of the sampled values, mean of the pulse durations, mean of the rise time, mean of the fall-time, mean of the relative duty cycle and so on,
Route Mean Square (RMS) mean of the amplitude, the pulse durations, the rise time, the fall-time, the relative duty cycles and so on.

The determination of a level-based and/or time-based distribution of frequencies of occurrence is implemented continuously:

In a first variant of the invention, a level-based and/or time-based distribution of frequencies of occurrence is determined in successive time portions, in each case exclusively from the sampled values of the registered and pre-processed measured signal of each time portion. The level-based and/or time-based distribution of frequencies of occurrence is consequently initialised at the beginning of every time portion.

In a second variant of the invention, the level-based and/or time-based distribution of frequencies of occurrence is determined continuously by deleting relatively older portions of the individual frequencies of occurrence from the level-based and/or time-based distribution of frequencies of occurrence, in each case in favour of currently determined portions of the individual frequencies of occurrence, or by reducing their significance in the level-based and/or time-based distribution of frequencies of occurrence by comparison with the currently determined proportions of the individual frequencies of occurrence by weighting with an appropriate weighting factor.

The determined level-based and/or time-based distributions of frequencies of occurrence are transmitted by the unit 12 for determining frequencies of occurrence to the processing unit 8 in order to present them to the user of the digital oscilloscope on the display 10.

In the next method step S30, the determined level-based and/or time-based distribution of frequencies of occurrence is compared with regard to differences with a previously determined reference-distribution of frequencies of occurrence in a unit 13 for determining deviations between determined frequencies of occurrence and reference frequencies of occurrence. Such differences indicate rare or sporadic signal events in the measured signal.

In the next method step S40, starting from the deviations between determined frequencies of occurrence and reference frequencies of occurrence established in the preceding method step S30, a first trigger condition is determined in a unit 14 for determining a trigger condition.

By preference, level-based and/or time-based threshold values which are disposed in those ranges of the determined level-based and/or time-based distribution of frequencies of occurrence in which a significant difference exists in each case between determined distribution of frequencies of occurrence and previously specified reference-distribution of frequencies of occurrence are specified as a trigger condition.

Figures 2A, 2B, 2C:
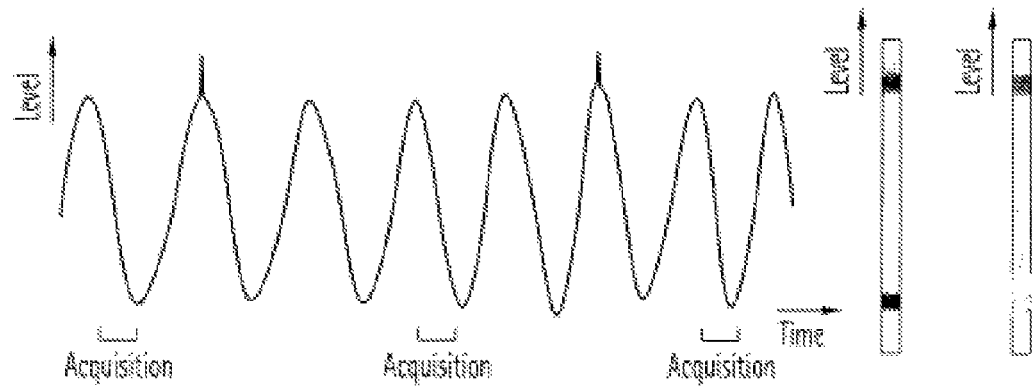
FIGS. 2A, 2B, 2C, and 2D illustrate a time-flow diagram of a signal with a sporadic signal event, a diagram with an associated level-based distribution of frequencies of occurrence, a diagram with a level-based reference-distribution of frequencies of occurrence and a time-flow diagram of the acquired second sinusoidal signal.

For sample, starting from a sinusoidal signal with individual rare or sporadic signal peaks at individual amplitudes of the sinusoidal signal, as shown in FIG. 2A, an associated level-based distribution of frequencies of occurrence as shown in FIG. 2B is determined which, by comparison with a reference-distribution of frequencies of occurrence as shown in FIG. 2C for a sinusoidal signal without sporadic signal peaks, provides frequency-of-occurrence values different from zero in the region of the signal peaks. In the region of this difference between determined distribution of frequencies of occurrence and reference-distribution of frequencies of occurrence, a level-based threshold value is specified, which leads to a triggering of the measured signal, as shown in FIG. 2A in the case of a signal peak.

Figure 2D:
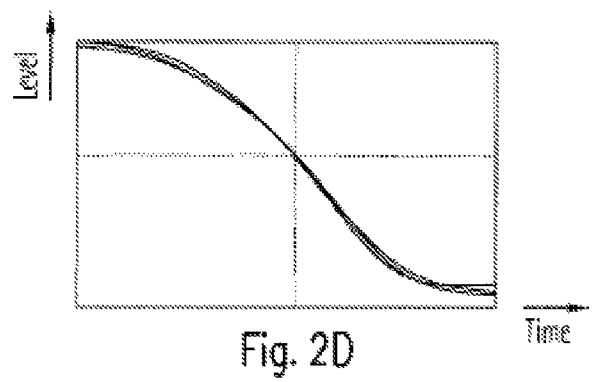

By contrast, an edge triggering at the threshold value specified in FIG. 2A according to the prior art would lead to the signal portions of the sinusoidal signal acquired in FIG. 2D and presented on a display, which, in each case, disadvantageously do not contain the rare or sporadic signal event of the signal peak.

Figure 15:
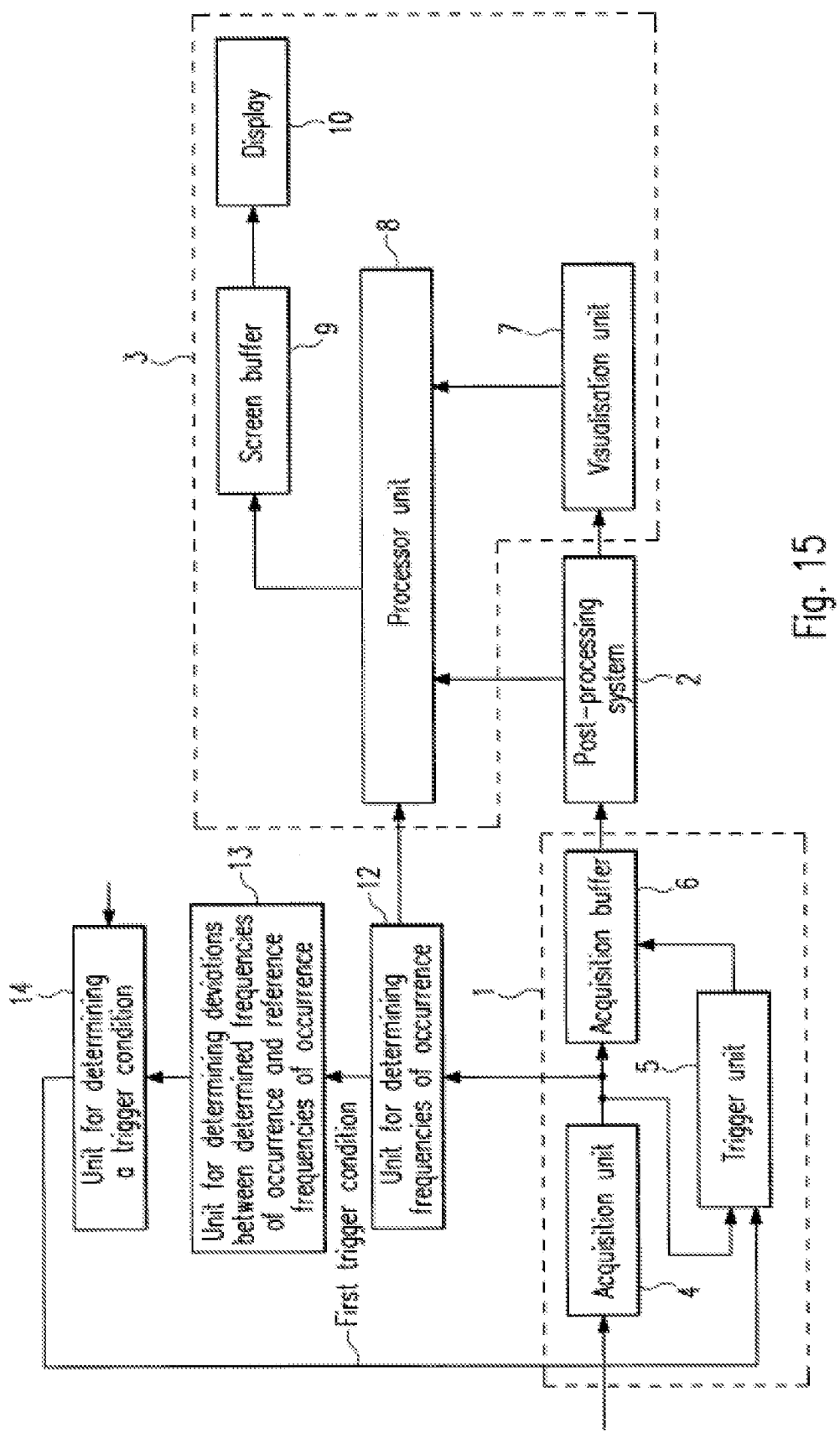
FIG. 15 illustrates block-circuit diagram of an exemplary embodiment of the device according to the invention for determining a trigger condition on the basis of a sporadic signal event.
Figure 16A:
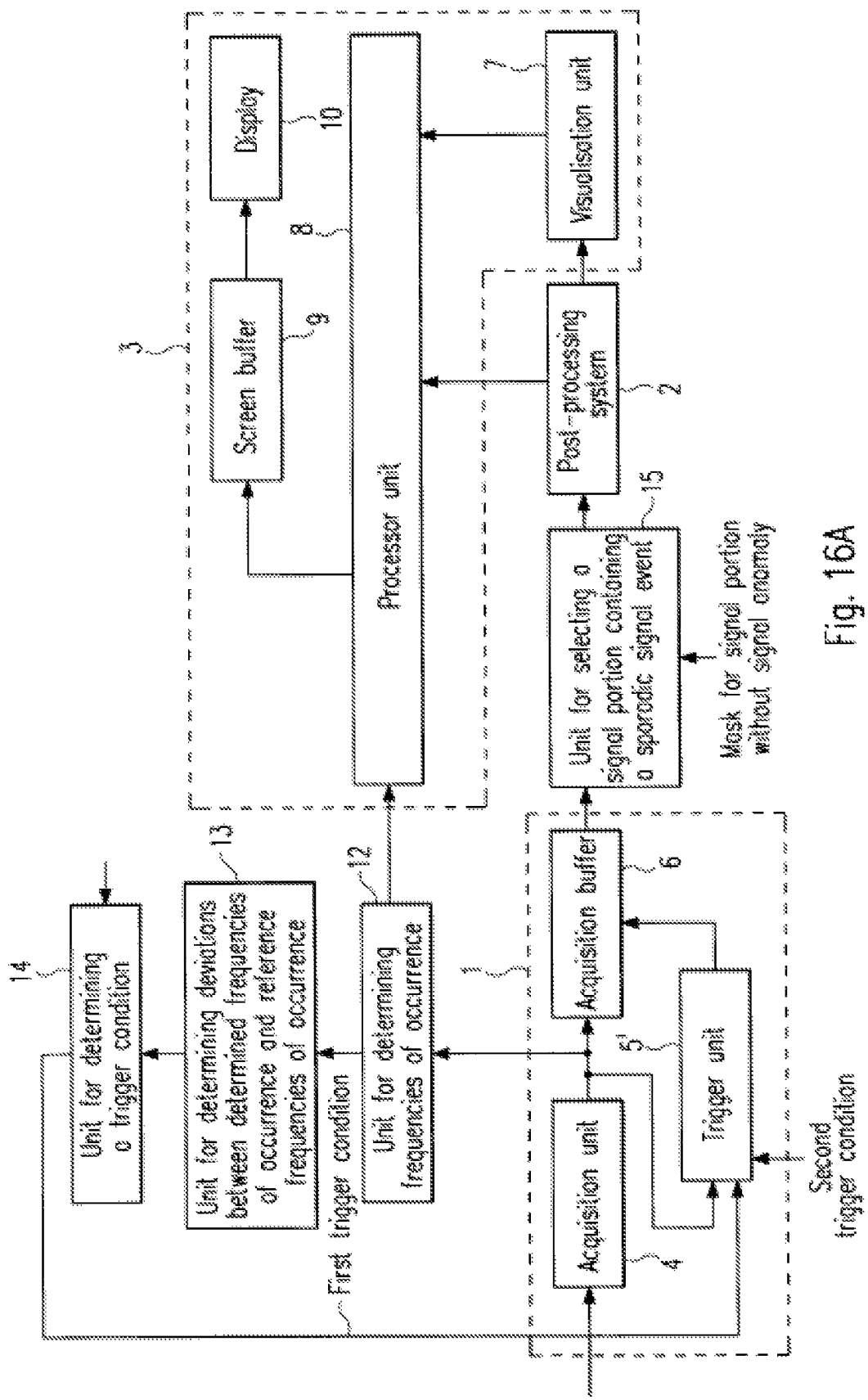
FIG. 16A illustrates a block-circuit diagram of a first embodiment of a preferred extension of the device according to the invention for determining a trigger condition on the basis of a sporadic signal event.

Optionally, the trigger condition is also manually adjusted by the user of the digital oscilloscope in the unit 14 for determining a trigger condition—indicated in FIGS. 15, 16A and 16AB by the arrow pointing towards the unit 14 for determining a trigger condition. In this context, the user of the oscilloscope can specify a trigger condition manually dependent upon the determined level-based and/or time-based distribution of frequencies of occurrence of the registered signal and taking into consideration a previously determined level-based or time-based reference-distribution of frequencies of occurrence.

By way of distinction from other trigger conditions, which will be described below, this trigger condition is designated in the following as a first trigger condition, and the level-based and/or time-based threshold values to be overshot or undercut are designated by analogy as first level-based and/or time-based threshold values.

In the subsequent method step S50, the sampled values of the measured signal registered and pre-processed by the acquisition unit 4 are compared in a trigger unit 5 with the first trigger condition established in the preceding method step S40 with regard to the occurrence of a trigger event. By preference, the sampled values of the measured signal registered and pre-processed by the acquisition unit 4 are compared in the trigger unit 5 with the first level-based and/or time-based threshold value established in the preceding method step S40 with regard to overshooting or undercutting. If the fulfilment of the first trigger condition by the registered and pre-processed sampled values of the measured signal, preferably an overshooting or undercutting of the first level-based and/or time-based threshold value by the registered and pre-processed sampled values of the measured signal, is identified, a trigger signal is activated by the trigger unit 5. In this context, reference is made to the fact that an identical threshold-value level should be used in each case for determining the time-based distribution of frequencies of occurrence and associated time-based reference-distribution of frequencies of occurrence.

In the subsequent method step S60, with the activation of the trigger signal, a determined sequence of registered and pre-processed sampled values of the measured signal relative to the time of activation of the trigger signal is acquired and stored in the acquisition buffer 6. The sequence length, the portion of the sequence length before the trigger event respectively after the trigger event is adjustable by the user.

The acquired sequence of sampled values of the measured signal is subjected to a signal post-processing in a downstream post-processing system 2. Typical functions of a signal post-processing are, for example:
- communication of the sampled values,
- digital filtering of the sampled values,
- preparation of a histogram with the frequency-of-occurrence values of parameters of the sampled values,
- jitter analysis,
- vectorial signal analysis,
- protocol decoding,
- measurement of the rise time or fall time, the pulse duration and so on,
- identification of a sequence of sampled values by means of level-time masks.

In the final method step S80, the screen contents to be displayed are determined from the acquired sequence of sampled values of the measured signal and from the results of the signal post-processing.

While the screen contents of the acquired sequence of sampled values of the measured signal are determined in a visualisation unit 7 downstream of the post-processing system 3 and supplied to a superordinate processor unit 8, the results of the signal post-processing in the superordinate processor unit 8 are inserted in an appropriate manner into the screen contents with the data of the acquired measured signal or integrated in separate screen contents. These determined screen contents are written successively into a screen buffer 9 adjacent to the processor unit 8 and then presented from this screen buffer 9 on the display 10 with the clock pulse of the image-refresh rate.

Figures 3A, 3B:
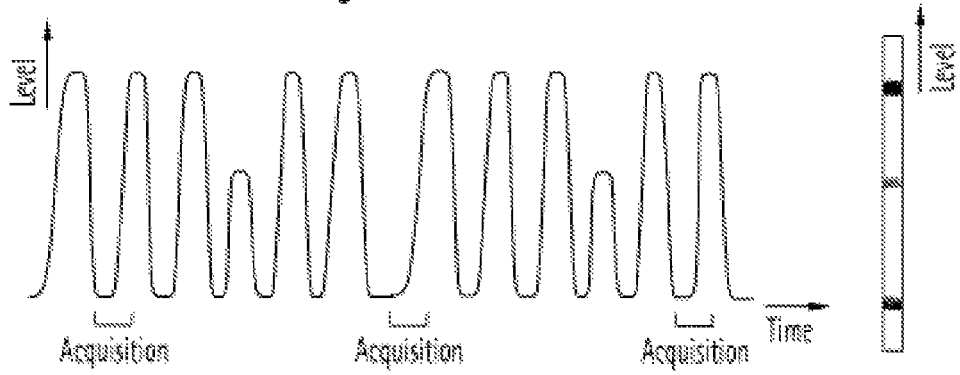
FIGS. 3A, 3B, and 3C illustrate a time-flow diagram of a signal with a sporadic signal event, a diagram with an associated level-based distribution of frequencies of occurrence and a time-flow diagram of the acquired signal.
Figure 3C:
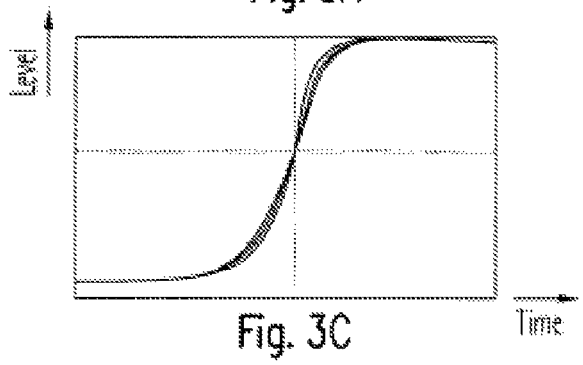

In addition to the signal with a rare or sporadic superposed signal peak shown in FIG. 2A, FIG. 3A shows a signal of which the rare and sporadic signal event is disposed at a significantly reduced amplitude. While a signal triggering in the case of an overshooting of a threshold value according to the prior art leads to acquired signal portions of the measured signal according to FIG. 3C, which disadvantageously do not contain the rare or sporadic signal event, a distribution of frequencies of occurrence of the signal according to FIG. 3B compared with a reference-distribution of frequencies of occurrence of a pure sinusoidal signal results in frequencies of occurrence different from zero in the region of the signal level zero. If a level-based threshold value in the region of the signal level zero is specified, a signal portion of signal which contains the rare or sporadic signal event with a significantly reduced amplitude can be acquired and presented on the display.

Figure 4A:
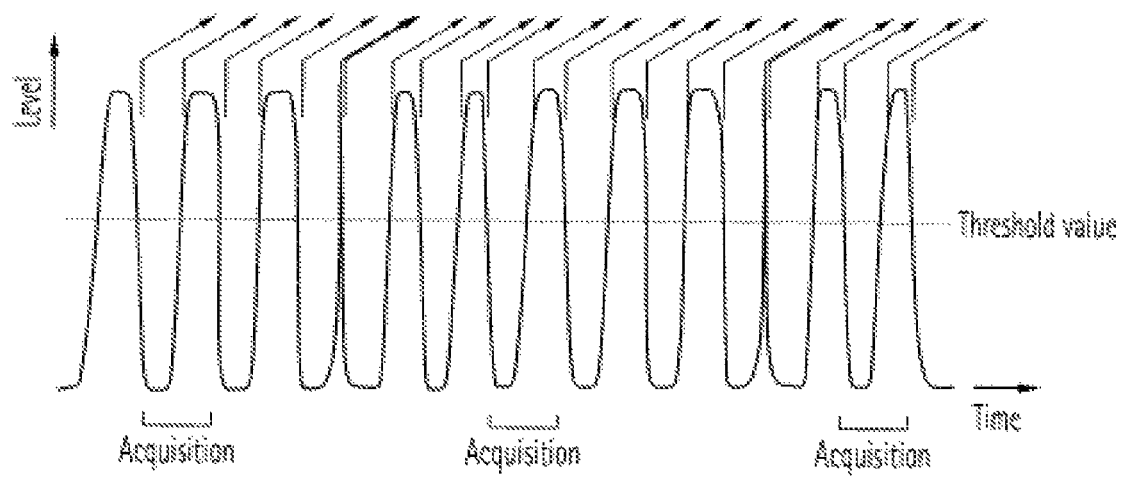
FIGS. 4A, 4B, and 4C illustrate a time-flow diagram of a signal with a sporadic signal event, a diagram with an associated time-based distribution of frequencies of occurrence and a time-flow diagram of the acquired signal.
Figure 4B:
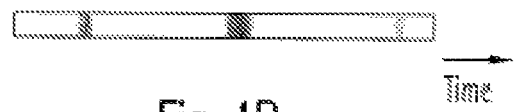
Figure 4C:
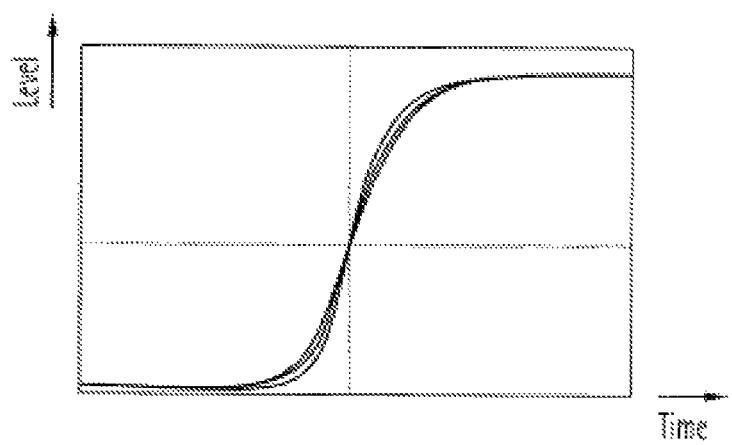

FIG. 4A shows the time characteristic of a signal which provides time-reduced periods as a rare or sporadic signal event and accordingly presents an example for a time-based triggering. If the time durations of the individual positive half periods are determined with the assistance of the threshold value presented in FIG. 4A, and a time-based distribution of frequencies of occurrence of the measured time duration is determined by means of a previously specified time raster, the time-based distribution of frequencies of occurrence presented in FIG. 4B is obtained. Alongside the frequencies of occurrence of a reference frequency of occurrence shown in the centre in FIG. 4B, it contains the frequencies of occurrence of an abbreviated half period shown on the left and the frequencies of occurrence of an extended half period shown on the right. By specifying a time-based threshold value in the region of the frequencies of occurrence illustrated on the left or right, signal portions of the third sinusoidal signal which each contain an abbreviated respectively extended half period can be acquired and presented on the display.

Figure 5A:
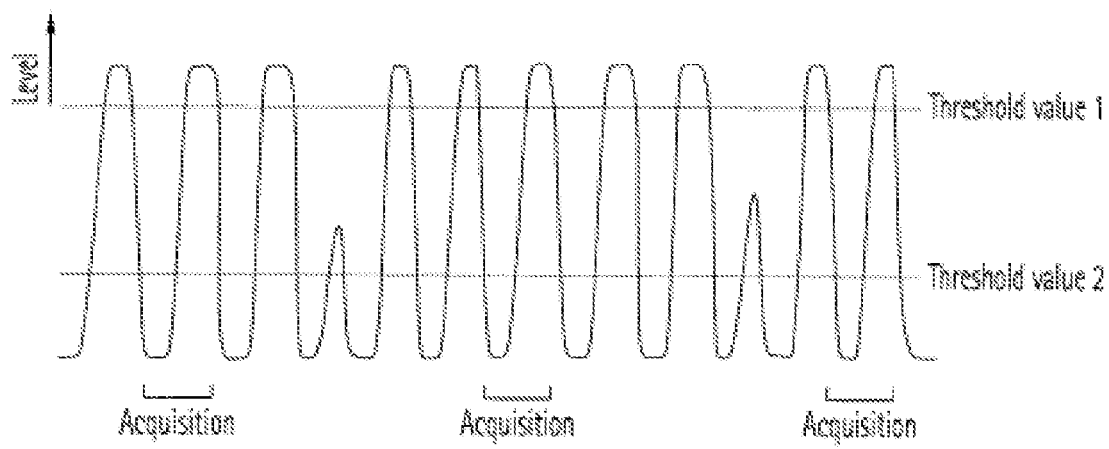
FIGS. 5A, 5B, 5C, and 5D illustrate a time-flow diagram of a signal with a sporadic signal event and two threshold values, two diagrams with associated time-based distributions of frequencies of occurrence in each case for one of the two threshold values and a time-flow diagram of the acquired signal.

FIG. 5A shows the time characteristic of a signal which, in an equivalent manner to the signal in FIG. 3A, also provides reduced amplitudes as a rare or sporadic signal event. A signal triggering in the event of an overshooting of a threshold value according to the prior art leads to acquired signal portions of the signal, which disadvantageously do not contain the rare or sporadic signal events with reduced amplitude, as shown in FIG. 5D. In each case the individual periods are registered with the two threshold values illustrated in FIG. 5A and, by means of a specified time raster, a time-based distribution of frequencies of occurrence of the measured time durations is determined in each case.

Figure 5B:
Figure 5C:
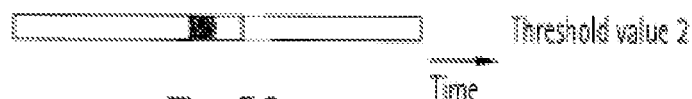
Figure 5D:
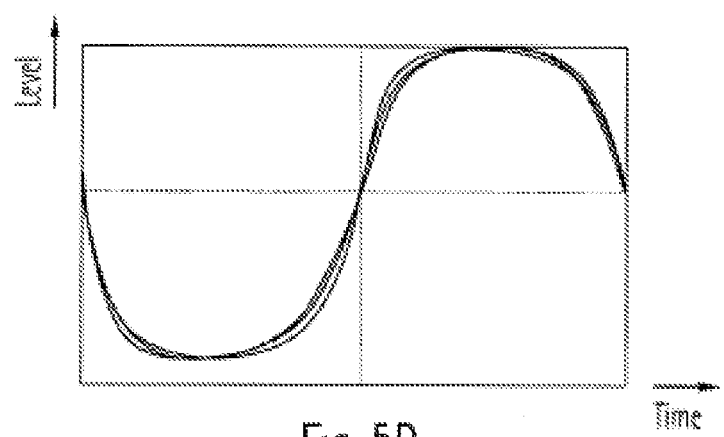

FIG. 5A shows the time-based distribution of frequencies of occurrence of the registered periods with the use of the threshold value 1, while FIG. 5B shows the time-based distribution of frequencies of occurrence of the registered periods with the use of the threshold value 2. The frequency-of-occurrence values presented centrally in the two time-based distributions of frequencies of occurrence represent a reference-distribution of frequencies of occurrence of a purely sinusoidal signal. Specifying a time-based threshold value in the region of the accumulations of frequencies of occurrence presented on the left respectively on the right in FIGS. 5B respectively 5C, allows an acquisition of a signal portion of the signal which contains a signal anomaly with reduced amplitude.

Figure 6A:
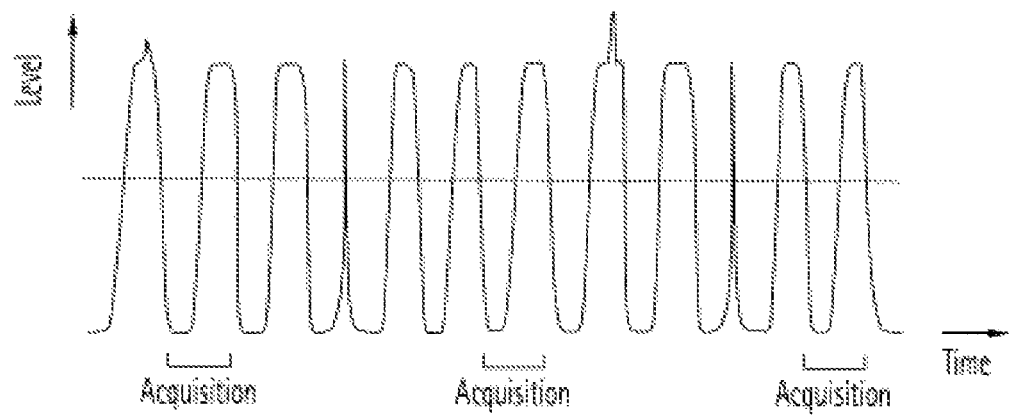
FIGS. 6A, 6B, 6C, and 6D illustrate a time-flow diagram of a signal, two diagrams in each case with an associated level-based and time-based distribution of frequencies of occurrence and a time-flow diagram of the acquired signal.

FIG. 6A shows the time characteristic of a signal which, as a rare or sporadic signal event, provides a signal at an amplitude and also a signal portion with a reduced period. A signal triggering in the event of an overshooting of a threshold value according to the prior art once again leads, as shown in FIG. 6D, to acquired signal portions of the signal which disadvantageously do not contain the signal anomaly of a signal peak or a reduced period. A time-based distribution of frequencies of occurrence of the signal with the registered period as the time-based parameter is shown in FIG. 6B, while a level-based distribution of frequencies of occurrence of the signal with the amplitude as the level-based parameter is shown in FIG. 6C.

Figure 6B:
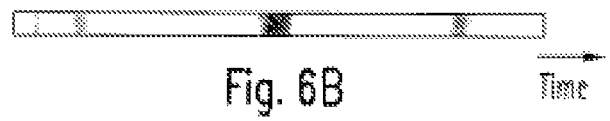
Figure 6C:
Figure 6D:
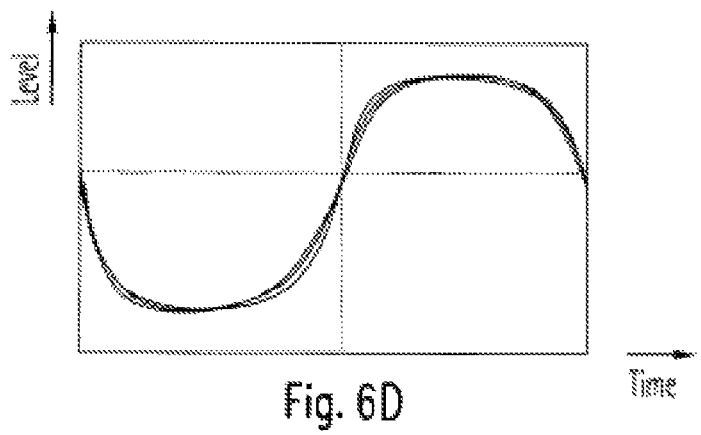

A signal triggering of the signal can be implemented either with a level-based threshold value, which can be determined in an appropriate manner from the level-based distribution of frequencies of occurrence according to FIG. 6B, or with a time-based threshold value, which can be determined in appropriate manner from the time-based distribution of frequencies of occurrence according to FIG. 6C. In the first case, a signal portion of the signal is acquired, which contains a signal peak as a rare or sporadic signal event, while, in the second case, a signal portion of the signal is acquired, which contains a signal portion with a reduced period as the rare or sporadic signal event. If the trigger event which is detected with the level-based threshold in the signal is combined in a trigger logic circuit, logically AND—linked to the trigger event which is detected with the time-based threshold value in the signal, the signal anomaly of a signal peak in a signal portion with a reduced period, not illustrated in FIG. 6A, can accordingly be detected and presented on a display.

Figure 7A:
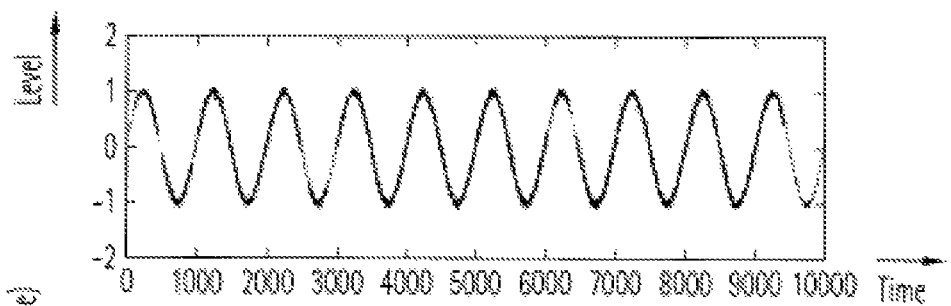
FIGS. 7A and 7B illustrate a time-flow diagram of noise-laden sinusoidal signal and a diagram of an associated level-based distribution of frequencies of occurrence.
Figure 7B:
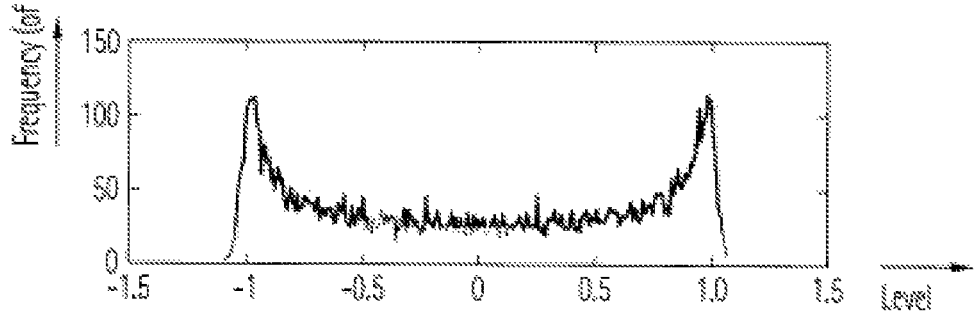
Figure 8A:
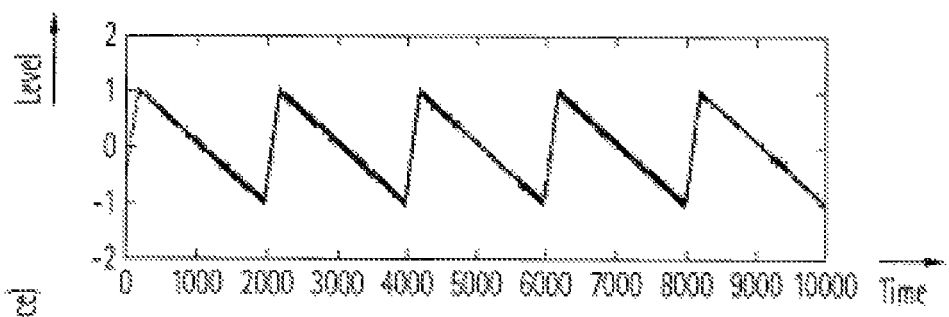
FIGS. 8A and 8B illustrate a time-flow diagram of a noise-laden saw-tooth signal and a diagram of an associated level-based distribution of frequencies of occurrence.
Figure 8B:
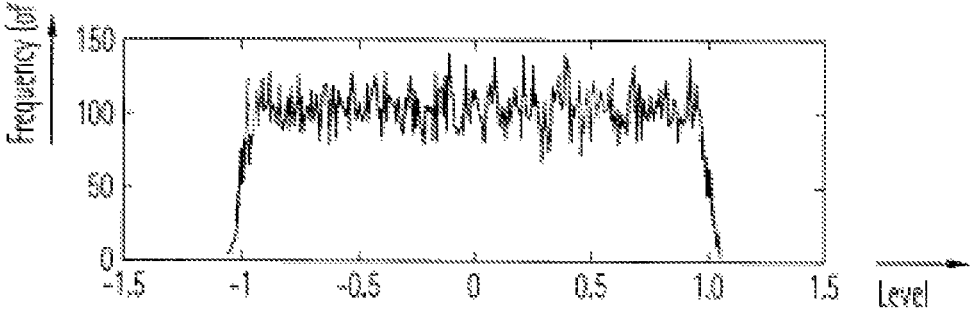
Figure 9A:
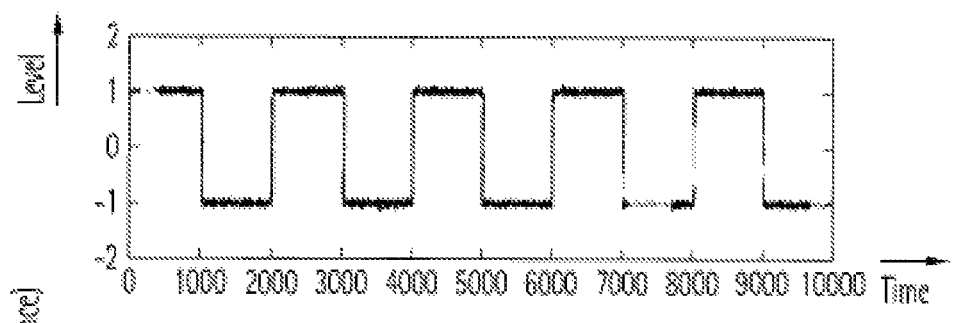
FIGS. 9A and 9B illustrate a time-flow diagram of a noise-laden binary signal and a diagram of an associated level-based distribution of frequencies of occurrence.
Figure 9B:
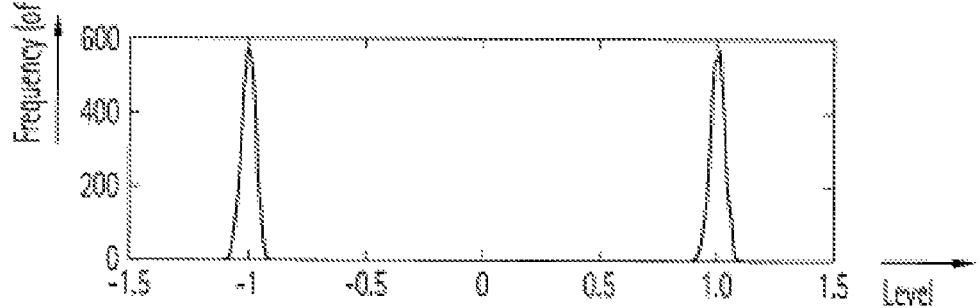

FIG. 7B shows a typical level-based reference-distribution of frequencies of occurrence for a noise-laden sinusoidal signal, of which the time characteristic is presented in FIG. 7A. In an equivalent manner, FIG. 8B shows a typical level-based reference-distribution of frequencies of occurrence for a noise-laden triangular signal, of which the time characteristic is shown in FIG. 8A. Finally, FIG. 9B shows a typical level-based reference-distribution of frequencies of occurrence for a noise-laden binary signal, of which the time characteristic is shown in FIG. 9A.

Figure 10A:
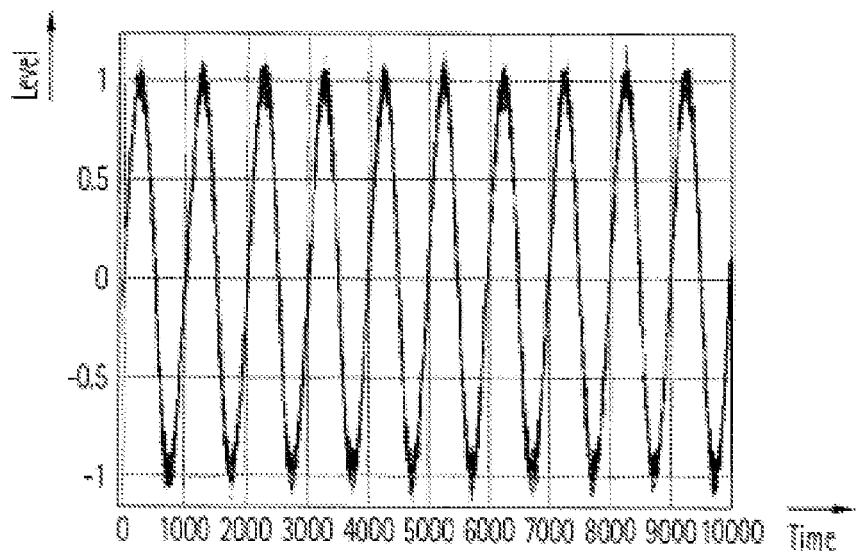
FIGS. 10A and 10B illustrate a time-flow diagram of a noise-laden sinusoidal signal and a diagram of an associated time-based distribution of frequencies of occurrence with different level-based threshold values.
Figure 10B:
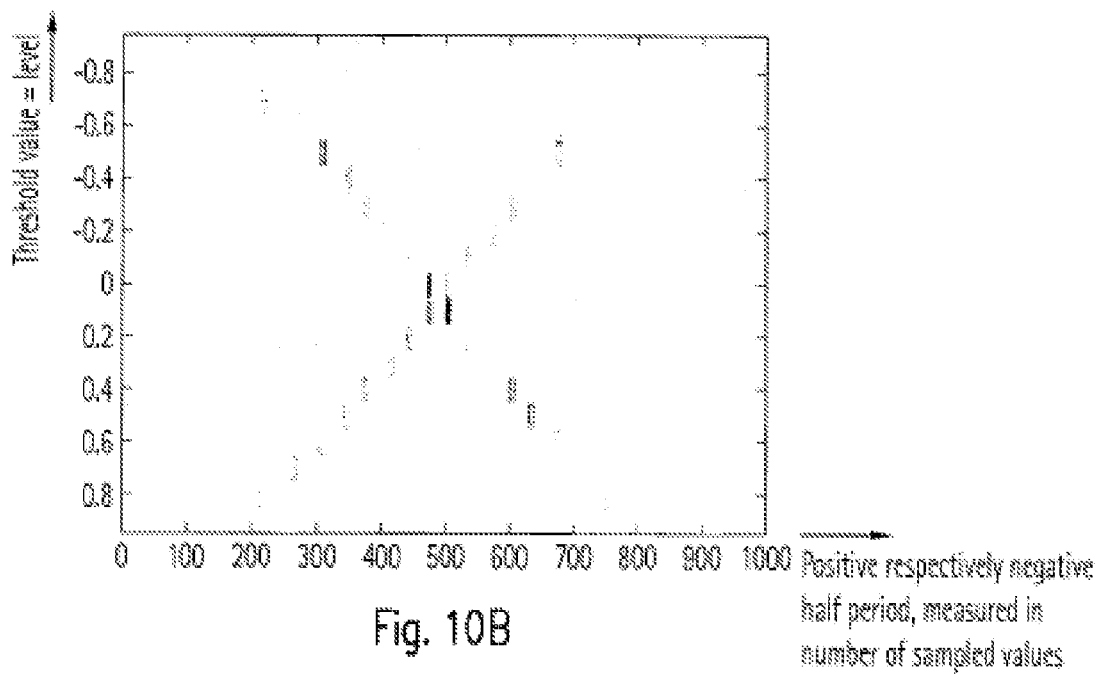
Figure 11A:
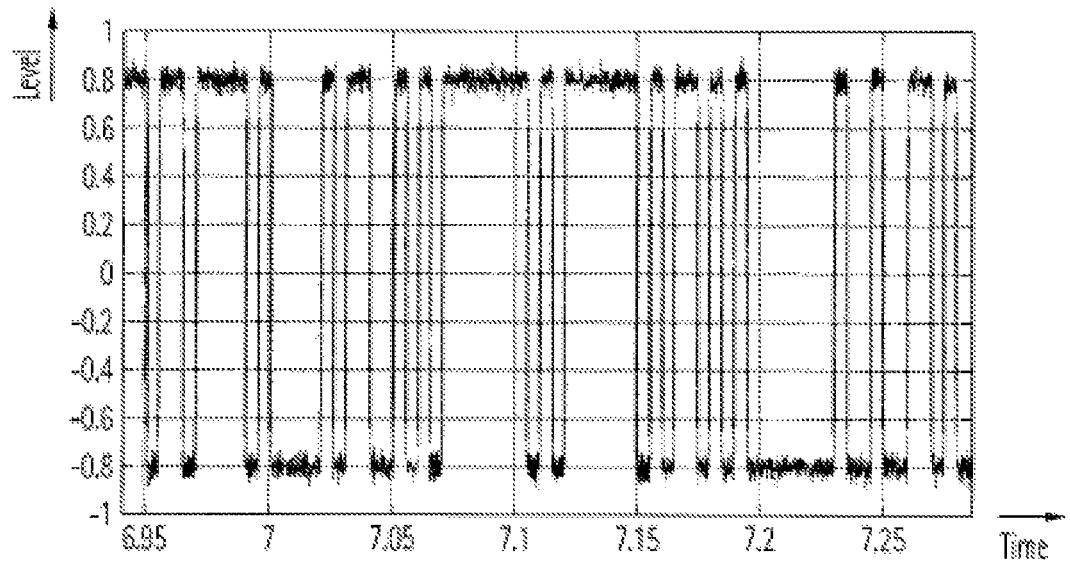
FIGS. 11A and 11B illustrate a time-flow diagram of a noise-laden binary signal and a diagram of an associated time-based distribution of frequencies of occurrence with different level-based threshold values.
Figure 11B:
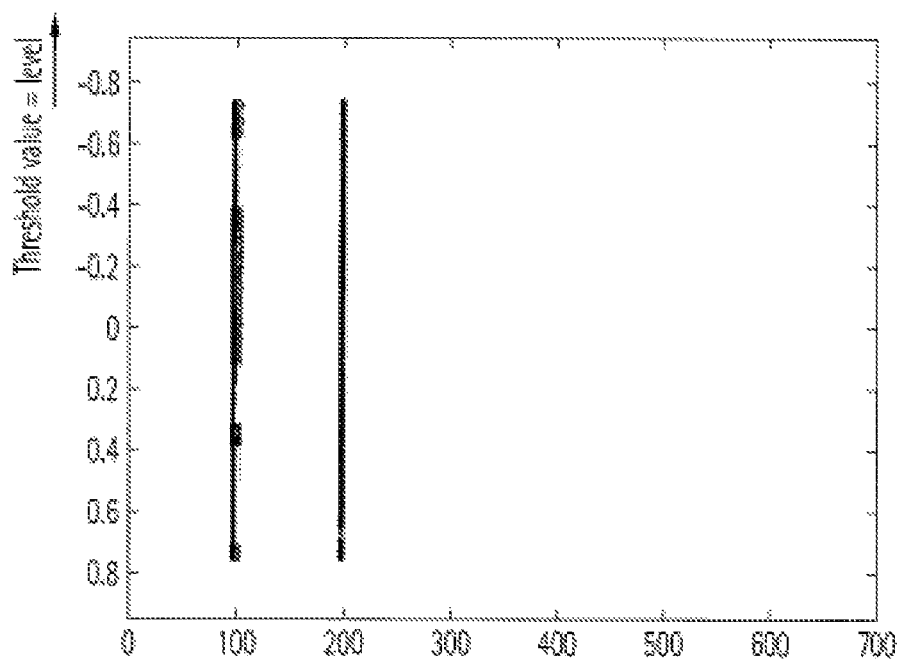

FIG. 10B shows a typical time-based reference-distribution of frequencies of occurrence for a noise-laden sinusoidal signal, of which the time characteristic is shown in FIG. 10A, with a positive respectively negative half period as the time-based parameter using different threshold-value levels. In an equivalent manner, FIG. 11B shows a typical time-based reference-distribution of frequencies of occurrence for a noise-laden binary signal, of which the time characteristic is shown in FIG. 11A, with the pulse duration as the time-based parameter using different threshold levels. An identical value of the threshold level in this context is substantial for determining a time-based distribution of frequencies of occurrence and also for the prior determination of an associated time-based reference-distribution of frequencies of occurrence.

In the following, a first embodiment of a preferred extension of the method according to the invention for determining the trigger condition on the basis of a rare or sporadic signal event is explained in detail with reference to the flow diagram in FIG. 18A in combination with the associated first embodiment of a preferred extension of the device according to the invention for determining a trigger condition on the basis of a rare or sporadic signal event with reference to the block-circuit diagram in FIG. 16A. In this context, with reference to the block-circuit diagram of the device according to the invention for determining a trigger condition on the basis of a rare or sporadic signal event in FIG. 15, identical functional units are shown with the same reference numbers and accordingly, a detailed explanation will not therefore be repeated.

Figure 17:
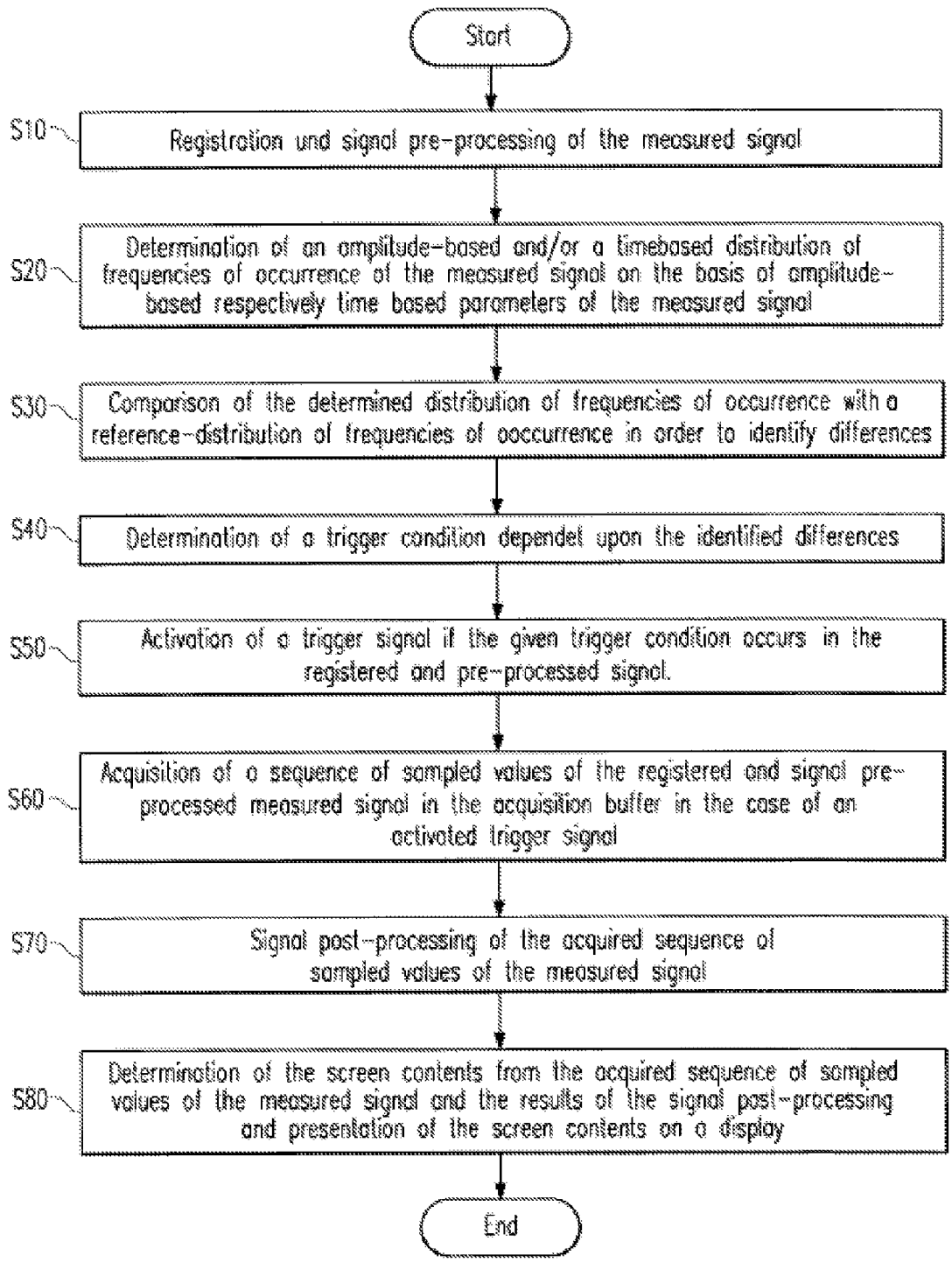
FIG. 17 illustrates a flow diagram of an exemplary embodiment of the method according to the invention for the determination of a trigger condition on the basis of a sporadic signal event.
Figure 18A:
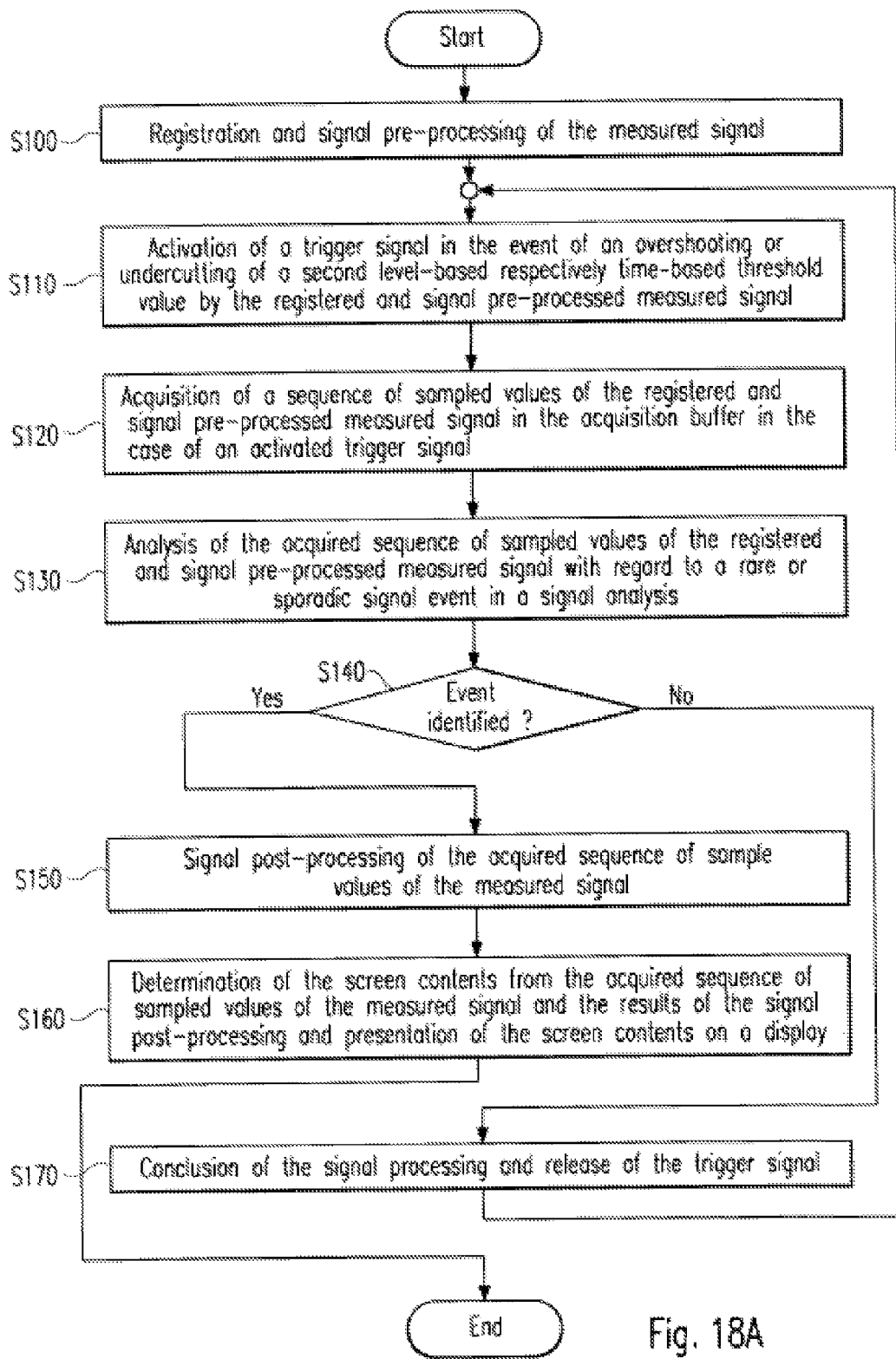
FIG. 18A illustrates a flow diagram of a first embodiment of a preferred of the method according to the invention for the determination of a trigger condition on the basis of a sporadic signal event.

In the first step S100 of the method according to the invention in FIG. 18A, in an equivalent manner to method step S10 of the method according to the invention from FIG. 17, the measured signal is registered and pre-processed in several signal pre-processing steps.

In the next method step S110, the sampled values of the registered and pre-processed measured signal are compared in a trigger unit 5' with a trigger condition—designated in the following as the second trigger condition—preferably a level-based and/or time-based threshold value,—designated in the following as the second level-based and/or time-based threshold value. If the occurrence of the second trigger condition in the sampled values of the registered and pre-processed measured signal is identified, a released trigger signal is activated in the trigger unit 5'.

With the activated trigger signal, a sequence of sampled values of the registered and pre-processed measured signal is acquired and buffered in the acquisition buffer 6 in the following method step S120. The entire sequence length, the sequence length before the trigger time and the sequence length after the trigger time of the acquired sequence of sampled values of the measured signal are freely adjustable.

In a unit 15 for selecting a signal portion containing the sporadic signal event, which is connected downstream of the acquisition buffer 6, the acquired sequence of sampled values of the measured signal is investigated with regard to a rare or sporadic signal event. For this purpose, the acquired sequence of sampled values of the measured signal is compared with a sequence of successive time portions, each with an upper and lower threshold value—a so-called level-time mask, which defines the level-time corridor for a correct signal without rare or sporadic signal event—matching the correct signal without signal anomaly.

If the acquired sequence of sampled values of the measured signal is not disposed completely within this level-time mask, a rare or sporadic signal event has been identified. If such a rare or sporadic signal event is identified in the following method step S140, the signal post-processing is continued in the next method step S150 after the signal analysis in the post-processing system 2 by analogy with method step S70 in the flow diagram of FIG. 17. Accordingly, a signal post-processing of full length is implemented (normal signal post-processing).

Finally, in method step S160, the screen contents for the acquired sequence of sampled values of the measured signal are determined in the visualisation unit 3. In the processor unit 8, the screen contents defined with acquired sampled values of the measured signal are additionally provided with the results of the signal post-processing determined by the post-processing system 2 and stored in a screen buffer 9, from which the screen data are read out at the image-refresh rate for presentation on a display 10.

If no rare or sporadic signal event is identified in method step S140, the signal post-processing is also terminated in method step S170 with the completion of the signal analysis. Consequently, an abbreviated signal post-processing is implemented. After the end of the abbreviated signal post-processing, the triggering is again released. With the release of the triggering, the sampled values of the registered and pre-processed measured signal are again compared in method step S110 with the second trigger condition, preferably with the second level-based respectively time-based threshold value, until the second trigger condition has been fulfilled—an overshooting or undercutting is preferably present—and accordingly, an activation of the trigger signal takes place.

Optionally, in method step S140, the number of signal analyses in different signal portions of the measured signal in which, in each case, no rare or sporadic signal event is detected can be determined, until a signal analysis in a signal portion of the measured signal with a detected rare or sporadic signal event is again implemented.

Figure 12:
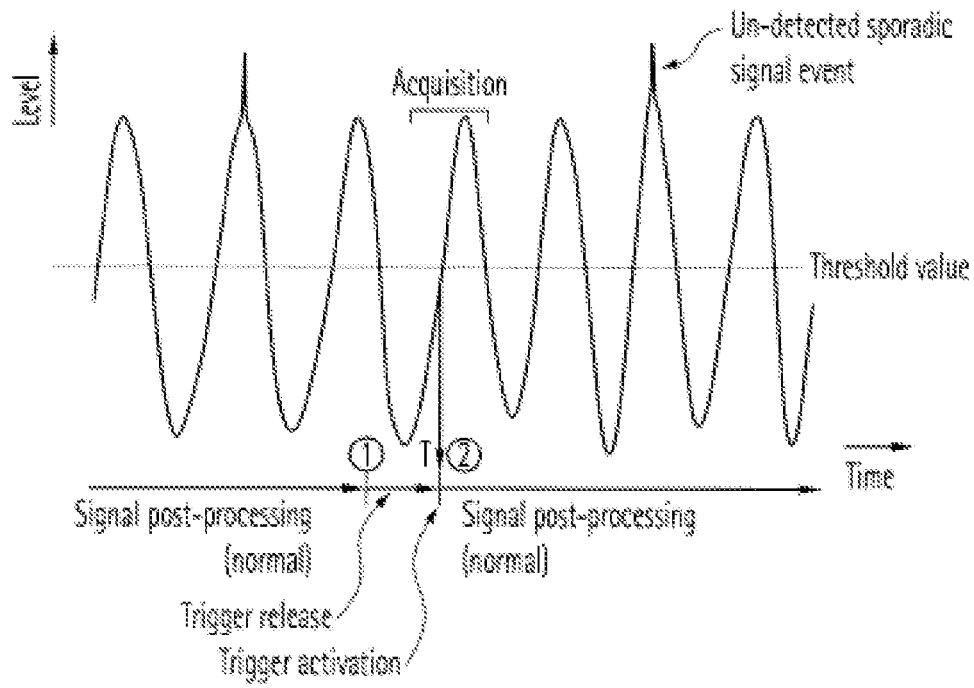
FIG. 12 illustrates a time-flow diagram of a signal with sporadic signal events and the associated oscilloscope processing steps according to the prior art.

FIG. 12 shows a time characteristic of a sinusoidal signal with rare or sporadic superposed signal peaks at individual amplitudes for a triggering according to the prior art. When viewing the time characteristic from left to right, a phase of signal post-processing is initially identifiable in which the triggering is not released and accordingly the rare or sporadic signal event of a signal peak is not acquired and accordingly also not presented on a display.

At time (1), the phase of signal post-processing has been completed, and accordingly the triggering is released again. At the time (2), the trigger condition—overshooting of the second threshold value, illustrated in FIG. 12, by the sampled values of the measured signal—is fulfilled, so that the signal portion of the measured signal presented in FIG. 12 is acquired and buffered in the acquisition buffer and subjected to a subsequent signal post-processing. Since the phase of signal post-processing lasts for a significant time duration, the signal anomaly of a signal peak on the sixth amplitude of the measured signal disadvantageously cannot be acquired and presented on the display.

Figure 13:
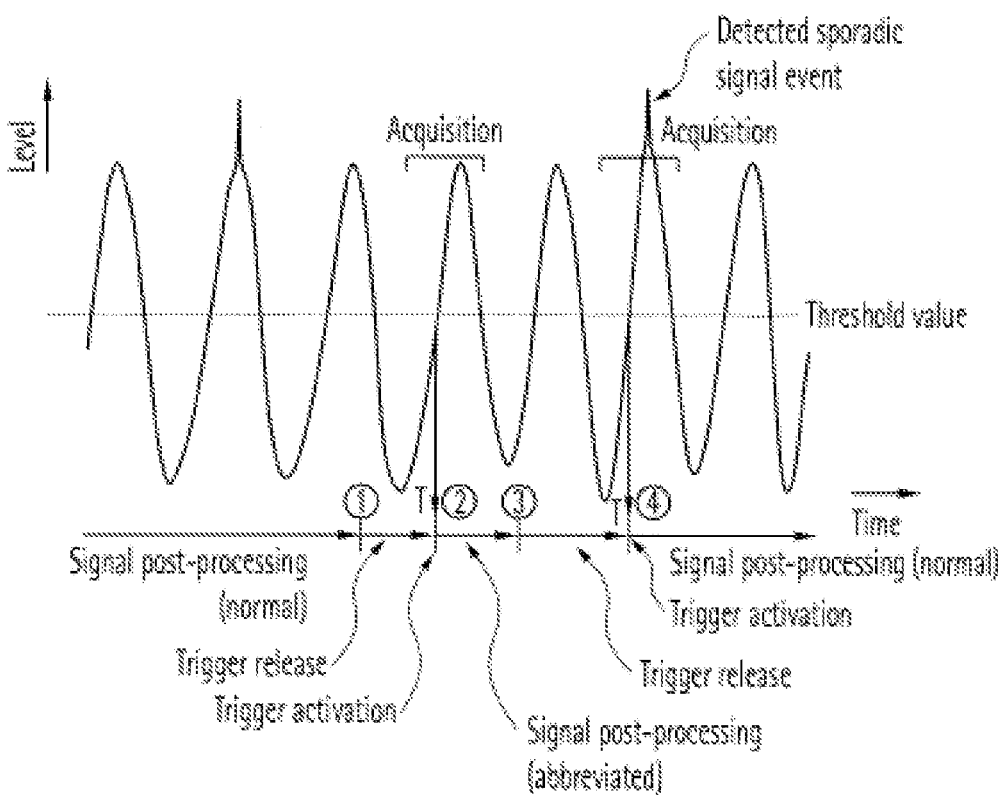
FIG. 13 illustrates a time-flow diagram of the signal with sporadic signal events and the associated oscilloscope processing steps according to a first embodiment of a preferred extension of the method according to the invention.

The time characteristic of the same sinusoidal signal with rare or sporadic superposed signal peaks at individual amplitudes in FIG. 13 provides the following phases for a triggering according to the invention:

When viewing of the time characteristic from left to right, a phase of the signal post-processing in which no triggering is released and accordingly, also, no signal acquisition takes place is initially obtained. The signal anomaly of the signal peak on the second amplitude is therefore not presented on the display. At the time (1), the signal post-processing is complete at its full length, and the triggering is released again.

At time (2), the signal overshoots the second threshold value which leads to an activation of the trigger signal. According to the invention, in a signal analysis of the signal post-processing, the acquired sequence of sampled values of the measured signal is investigated with regard to a rare or sporadic signal event. Since the acquired signal portion of the measured signal does not contain the rare or sporadic signal event of a signal peak, as shown in FIG. 13, the signal post-processing is abruptly interrupted after the signal analysis.

With the completion of the abbreviated signal post-processing at time (3), the trigger is released again and, with the next occurrence of the trigger condition,—an overshooting of the second threshold value by the measured signal—at time (4), a signal portion of the measured signal is acquired. This acquired signal portion of the measured signal is investigated in a signal analysis of the signal post-processing after the time (4) with regard to the presence of a signal anomaly of a signal peak. Since the signal peak is contained in the acquired signal portion, as shown in the FIG. 13, the signal post-processing is implemented up to its full length, and the acquired signal portion is presented on the display with the signal anomaly of the signal peak.

Figure 16B:
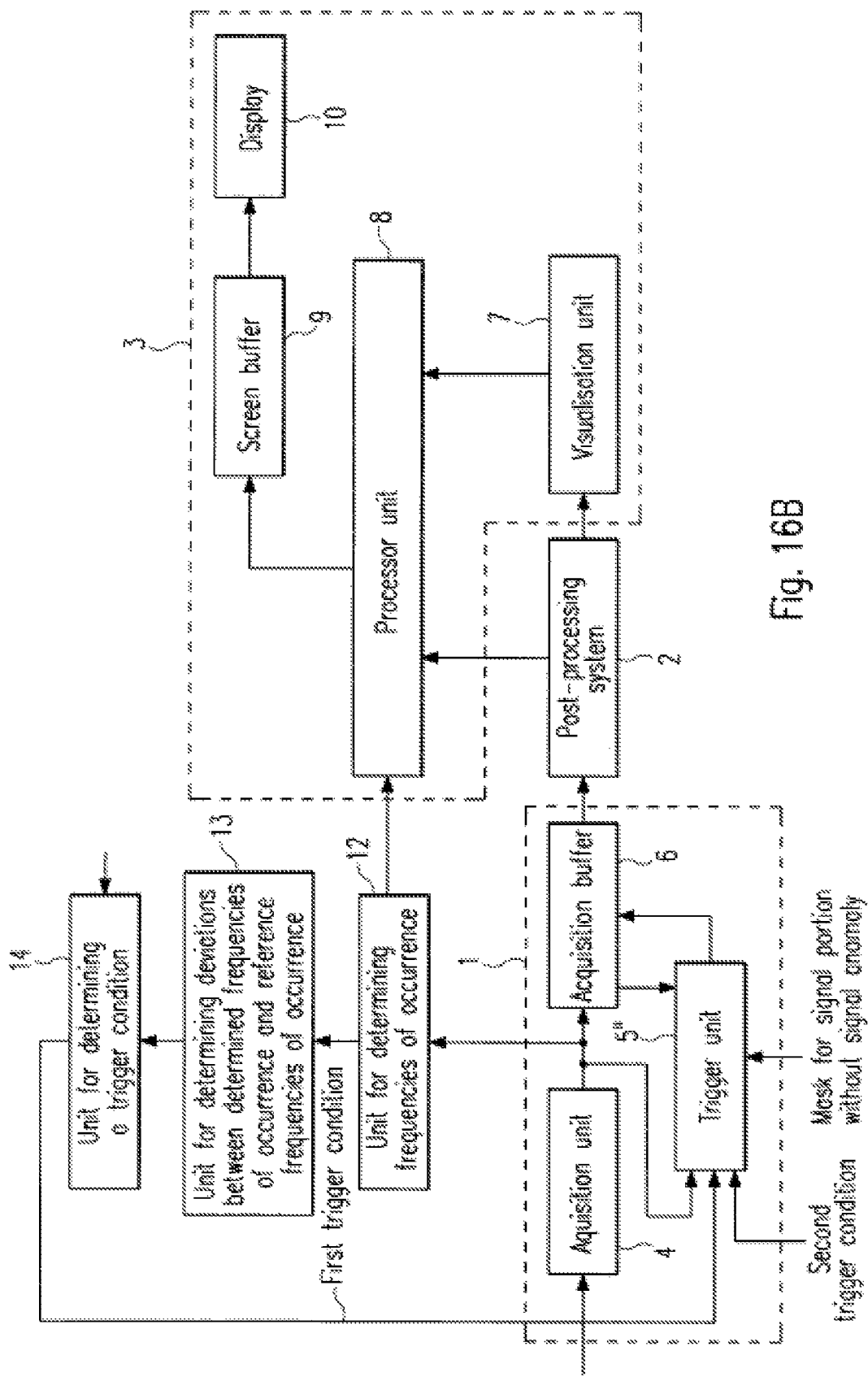
FIG. 16B illustrates a block-circuit diagram of a second embodiment of a preferred extension of the device according to the invention for determining a trigger condition on the basis of a sporadic signal event.
Figure 18B:
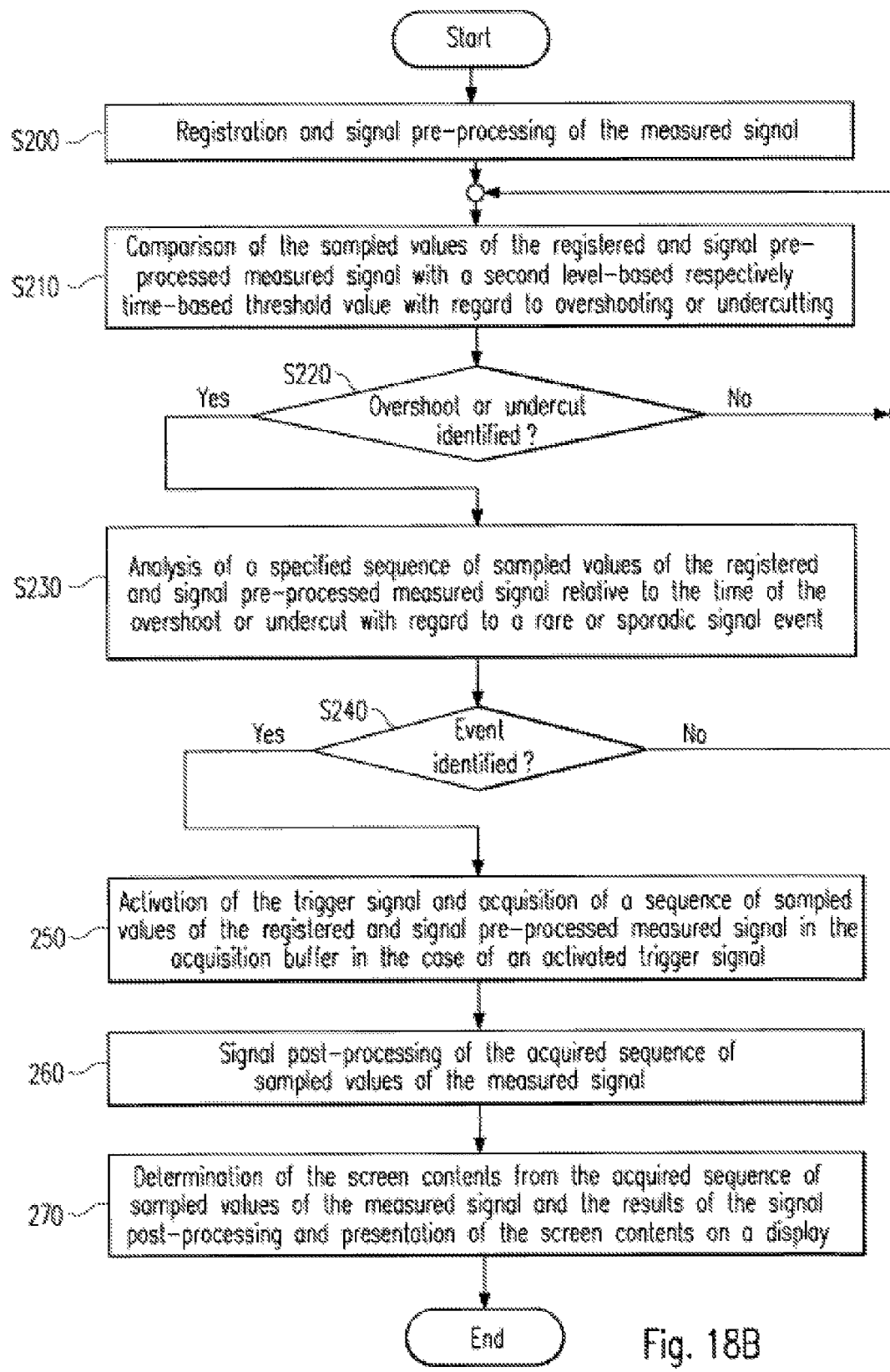
FIG. 18B illustrates a flow diagram of a second embodiment of a preferred extension of the method according to the invention for determining a trigger condition on the basis of a sporadic signal event.

In the following, a second embodiment of a preferred extension of the method according to the invention for determining a trigger condition on the basis of a rare or sporadic signal event is explained in detail with reference to the flow diagram in FIG. 18B in combination with the associated second embodiment of a preferred extension of the device according to the invention for determining a trigger condition on the basis of a rare or sporadic signal event with reference to the block-circuit diagram in FIG. 16B.

In the first method step S200, the measured signal is registered and pre-processed in an acquisition unit 4 in an equivalent manner to the first method step S100 of the first embodiment.

In the next method step S210, the sampled values of the registered and pre-processed measured signal are compared in a trigger unit 5" with a second trigger condition, preferably a second level-based and/or time-based threshold value.

If the occurrence of the second trigger condition, preferably the overshooting or undercutting of the second level-based and/or time-based threshold value by the sampled values of the registered and pre-processed measured signal is not identified in method step S220, the sampled values of the registered and pre-processed measured signal continue to be compared according to method step S210 with the second level-based and/or time-based threshold value with regard to overshooting or undercutting.

By contrast, if the occurrence of the second trigger condition, preferably an overshooting or undercutting of the second level-based and/or time-based threshold value by the sampled values of the registered and pre-processed measured signal, is identified in the subsequent method step S220, a signal portion of the registered and pre-processed measured signal is investigated in the trigger unit 5" relative to the identified trigger time with regard to a rare or sporadic signal event.

For this purpose, in an equivalent manner to the unit 15 for selecting a signal portion containing a rare or sporadic signal event in the first embodiment, the trigger unit 5" uses a level-time mask mask, in each case made from time portions in time succession with an upper and lower limit value. If the investigated signal portion of the registered and pre-processed measured signal is not disposed completely within the specified level-time mask, a rare or sporadic signal event is present in the investigated signal portion and has therefore been identified.

In the next method step S240, if no rare or sporadic signal event is identified in the signal portion of the measured signal investigated, no activation of the trigger signal takes place and also no acquisition of the sampled values of the registered and pre-processed measured signal relative to the identified trigger time. In this case, the sampled values of the registered and pre-processed measured signal continue to be compared according to method step S210 with the second trigger condition, preferably the second level-based and/or time-based threshold value.

By contrast, if a rare or sporadic signal event is identified in the investigated signal portion of the measured signal in method step S240, the trigger signal is activated in the subsequent method step S250, and a sequence of sampled values of the registered and pre-processed measured signal is acquired and buffered in the acquisition buffer 6.

In this context, the sequence of acquired sampled values is guided by the trigger time. Typically, this is the time of the overshooting or undercutting of the second level-based or time-based threshold value by the sampled values of the registered and pre-processed measured signal. Relative to this trigger time, a sequence of sampled values of the measured signal is acquired in which the rare or sporadic signal event is also contained. Alternatively, the time of the identified rare or sporadic signal event can also be used as the trigger event. In this case also, a sequence of sampled values of the measured signal is acquired in which the rare or sporadic signal event is contained.

With the sequence of acquired sampled values of the measured signal, a signal post-processing is implemented in the subsequent method step S260 in the post-processing system 2 in an equivalent manner to method step S70 in the flow diagram of FIG. 17.

Finally, in the concluding method step S270, in an equivalent manner to method step S170 of the first embodiment, the screen content for the acquired sequence of sampled values of the measured signal is determined in the visualisation unit 3. In the processor unit 8, the screen contents defined with acquired sampled values of the measured signal are additionally provided with the results of the signal post-processing determined by the post-processing system 2 and buffered in the screen buffer 9, from which the screen data are read out at the image-refresh rate for presentation on a display 10.

Optionally, in method step S240, the number of signal analyses in different signal portions of the measured signal can be determined in which, in each case, no rare or sporadic signal event is detected, until a signal analysis is once again implemented in a signal portion of the measured signal with a detected rare or sporadic signal event.

Figure 14:
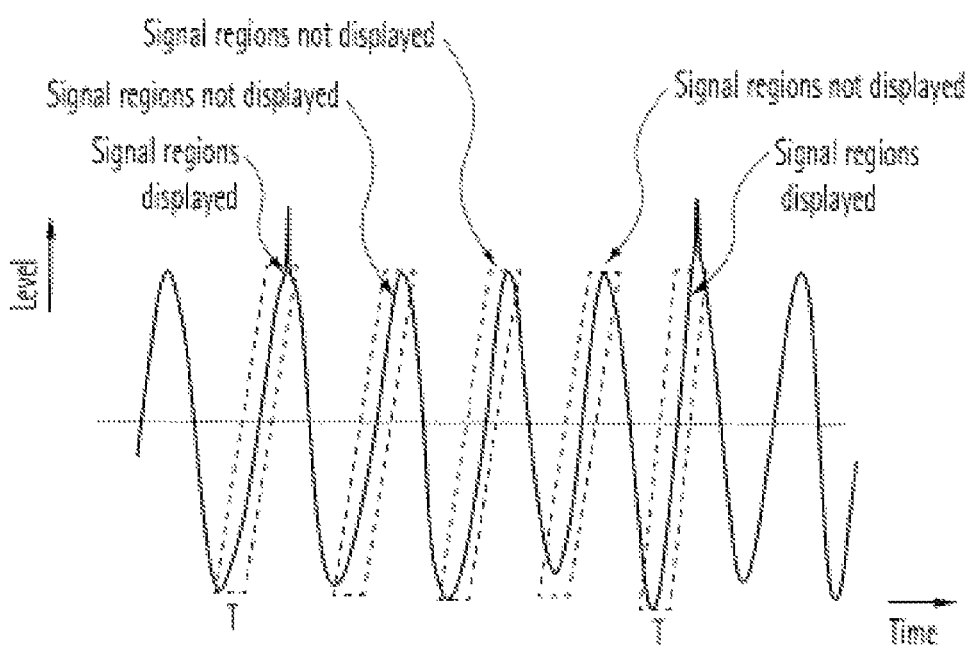
FIG. 14 illustrates a time-flow diagram of the signal with sporadic signal events and the associated oscilloscope processing steps according to a second embodiment of a preferred extension of the method of the invention.

FIG. 14, which once again illustrates the time characteristic of the same sinusoidal signal with rare or sporadic signal peaks at individual amplitudes, shows shaded in light grey, for the second embodiment of the preferred extension of the method according to the invention, the signal portions in which no rare or sporadic signal event has been identified after an analysis with a specified level-time mask and accordingly, no signal triggering, signal acquisition and signal presentation on display is implemented. By contrast, a rare or sporadic signal event is identified by the trigger unit in an analysis with a specified level-time mask in the signal portions shaded in dark grey, and accordingly, a signal triggering, signal acquisition and signal presentation on the display is implemented.

The invention is not restricted to the embodiments and variants presented. In particular, all combinations of all features claimed in each case in the claims, all features disclosed in each case in the description and all features illustrated in each case in the figures of the drawings are also covered by the invention.

The invention claimed is:

1. A method for determining a trigger condition based on a rare signal event in a registered signal, the method comprising:
   determining a level-based and/or time-based frequency of occurrence of level-based and/or time-based parameters determined from sampled values of the registered signal in a specified corresponding level-raster and/or time-raster;
   comparing a distribution of the determined level-based and/or time-based frequencies of occurrence with a previously determined corresponding level-based and/or time-based reference-distribution of frequencies of occurrence;
   determining the trigger condition dependent upon an identified difference between corresponding level-based and/or time-based distribution of frequencies of occurrence and corresponding level-based and/or time-based reference-distribution of frequencies of occurrence; and
   activating a trigger signal if the trigger condition occurs in the registered signal,
   wherein the trigger condition is a first level-based and/or time-based threshold value which is to be overstepped or undercut by the registered signal, and
   wherein the first level-based threshold value or the first time-based threshold value is disposed in a corresponding level-range or time-range of the corresponding level-based and/or time-based parameter in which a difference between the determined corresponding level-based and/or time-based distribution of frequencies of occurrence and the corresponding level-based and/or time-based reference-distribution of frequencies of occurrence is identified.

2. The method according to claim 1, wherein the level-based and/or time-based parameter of the registered signal is a corresponding level-based and/or time-based statistical parameter of the registered signal.

3. The method according to claim 1, wherein the level-based and/or time-based frequency of occurrence is determined from new in each case over successive measuring intervals.

4. The method according to claim 1, wherein the level-based and/or time-based distribution of frequencies of occurrence is continuously updated by considering earlier determined portions of the level-based and/or time-based distribution of frequencies of occurrence more weakly in the level-based and/or time-based distribution of frequencies of occurrence.

5. The method according to claim 1, wherein the level-based and/or time-based distribution of frequencies of occurrence is continuously updated by removing earlier determined portions of the level-based and/or time-based distribution of frequencies of occurrence from the level-based and/or time-based distribution of frequencies of occurrence.

6. The method according to claim 1, wherein the time-based distribution of frequencies of occurrence is determined in each case for different, first level-based threshold values.

7. The method according to claim 1, wherein the comparison of the determined distribution of frequencies of occurrence with a previously given reference-distribution of frequencies of occurrence is implemented by means of correlating the determined distribution of frequencies of occurrence with a previously given reference-distribution of frequencies of occurrence.

8. A method for determining a trigger condition based on a rare signal event in a registered signal, the method comprising:
   determining a level-based and/or time-based frequency of occurrence of level-based and/or time-based parameters determined from sampled values of the registered signal in a specified corresponding level-raster and/or time-raster;
   comparing a distribution of the determined level-based and/or time-based frequencies of occurrence with a previously determined corresponding level-based and/or time-based reference-distribution of frequencies of occurrence;
   determining the trigger condition dependent upon an identified difference between corresponding level-based and/or time-based distribution of frequencies of occurrence and corresponding level-based and/or time-based reference-distribution of frequencies of occurrence; and
   activating a trigger signal if the trigger condition occurs in the registered signal,
   wherein the trigger condition is a first trigger condition and the trigger signal is a first trigger signal, and
   wherein, with the occurrence of a second trigger condition in the registered signal, a second trigger signal is activated with which a signal portion of the registered signal is acquired in which the rare signal event is identified in a signal post-processing.

9. The method according to claim 8, wherein, in the case of a rare signal event identified in the acquired signal portion, the acquired signal portion of the registered signal is presented on a display device.

10. The method according to claim 8, wherein, if a rare signal event is not-identified in the acquired signal portion, the acquired signal portion of the registered signal is not presented on a display device, and the triggering of the registered signal is released again.

11. The method according to claim 8, wherein the rare signal event is identified in the acquired signal portion if the acquired signal portion also comes to be disposed outside a specified mask made from individual, successive time portions, in each case with an upper and lower threshold value.

12. The method according to claim 8, wherein a trigger signal with which a signal portion of the registered signal is acquired is activated if the occurrence of the second trigger condition is present in the registered signal and, at the same time, a rare signal event is identified in the signal portion of the registered signal to be acquired.

13. The method according to claim 12, wherein the frequency of occurrence of the second trigger condition in the registered signal is determined if, at the same time, no rare signal event is identified in the signal portion of the registered signal to be acquired.

14. The method according to claim 8, wherein the second trigger condition is a second level-based and/or time-based threshold value which is to be overstepped or undercut by the registered signal.

15. A device for determining a trigger condition based on a rare signal event in a registered signal, comprising:
- an acquisition buffer with acquired sampled values of the registered signal; and
- a trigger unit supplied with the sampled values of the registered signal and connected to the acquisition buffer for generation of a trigger signal,
- wherein a unit for determining a trigger condition is connected upstream of the trigger unit,
- wherein the unit for determining the trigger condition is connected to a unit for determining a deviation between determined frequencies of occurrence and reference frequencies of occurrence, and
- wherein the unit for determining the deviation is connected to a unit for determining frequencies of occurrence which is connected at the input end to the input of the acquisition buffer.

16. The device according to claim 15, wherein a unit for selecting a signal portion of an acquired signal containing the rare signal event is interconnected between the acquisition buffer and a display.

* * * * *